United States Patent
Kapur et al.

(10) Patent No.: US 6,385,750 B1
(45) Date of Patent: May 7, 2002

(54) METHOD AND SYSTEM FOR CONTROLLING TEST DATA VOLUME IN DETERMINISTIC TEST PATTERN GENERATION

(75) Inventors: Rohit Kapur, Cupertino, CA (US); Thomas W. Williams, Boulder, CO (US); John Waicukauski, Tualatin, OR (US); Peter Wohl, Williston, VT (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/387,865

(22) Filed: Sep. 1, 1999

(51) Int. Cl.$^7$ ................................................ G06F 11/00
(52) U.S. Cl. ........................................ 714/738; 714/724
(58) Field of Search .................................. 714/738, 724

(56) References Cited

U.S. PATENT DOCUMENTS 5,696,771 A * 12/1997 Beausang et al. ............ 714/727
6,256,759 B1 * 7/2001 Bhawmik et al. ............ 714/726
6,311,317 B1 * 10/2001 Khoche et al. ................ 716/18

* cited by examiner

Primary Examiner—Phung M. Chung
(74) Attorney, Agent, or Firm—Wagner Murabito & Hao LLP

(57) ABSTRACT

A method and system for improving the fault coverage of test vectors for testing integrated circuits. The present invention also provides a method and system for reducing the number of deterministic test vectors required for testing integrated circuits by inserting test points in a cost effective manner. According to an embodiment of the present invention, a fault list having all the potential faults of an integrated circuit design is initialized and all the potential faults are marked as untestable. A set of test patterns, T, for testing several of the potential faults are generated. A fault simulation process is then performed on the integrated circuit design with the test patterns, T, to mark off untested faults. During fault simulation, fault propagation is monitored to determine the nets in the design to which faults were propagated. The nets at which fault propagation discontinues (e.g., de-sensitized) are also monitored. This information is collected over the set of test patterns, T. Based on the fault propagation information, test points are selectively inserted to maximize the fault coverage of the set of test patterns, T. In one embodiment, the nets to which most untested faults propagate are selected for test point insertion. The number of test points selected may be determined by user-defined parameters. These steps are then repeated for another set of set patterns until the desired fault coverage is achieved. By adding test points, the fault coverage of the test patterns is significantly improved, thus reducing the test data volume.

30 Claims, 7 Drawing Sheets

METHOD AND SYSTEM FOR CONTROLLING TEST DATA VOLUME IN DETERMINISTIC TEST PATTERN GENERATION

FIELD OF THE INVENTION

The present invention pertains to the field of electronic design automation. More particularly, aspects of the present invention pertain to methods and systems for automatic test pattern generation (ATPG).

BACKGROUND OF THE INVENTION

The rapid growth of the complexity of modern electronic circuits has forced electronic circuit designers to rely upon computer programs to assist and automate most steps of the circuit design process. Typical circuits today contain hundreds of thousands or millions of individual pieces or "cells." Such a design is much too large for a circuit designer or even a team of engineers to effectively manage manually. To automate the circuit design and fabrication of integrated circuit devices, electronic design automation (EDA) systems have been developed.

An EDA system is a computer software system designers use for designing integrated circuit (IC) devices. The EDA system typically receives one or more high level behavioral descriptions of an IC device (e.g., in HDL languages like VHDL, Verilog, etc.) and translates this behavioral description into netlists of various levels of abstraction. At a higher level of abstraction, a generic netlist is typically produced based on technology independent primitives. A netlist describes the IC design and is composed of nodes (elements) and edges, e.g., connections between nodes, and can be represented using a directed cyclic graph structure having nodes which are connected to each other with signal lines. The netlist description is typically stored in computer readable media within the EDA system and processed and verified using many well known techniques. The EDA system ultimately produces a physical device layout in mask form which can be used to directly implement structures in silicon to realize the physical IC device.

Due to complications in the fabrication process, some fabricated IC devices may not be fully functional. Therefore, chip testing must be performed before shipment to customers. In order to facilitate chip-testing, some ICs include special logic circuits that are designed for enhancing testability (e.g., scan chains). In addition, some EDA systems include automatic test pattern generation (ATPG) processes for analyzing the various representations of the netlist designs and for automatically generating test patterns therefrom. A test pattern is created for a fault modeled in the design such that when the fault exists the observable behavior of the correctly operable IC would be different than that of an IC without that fault present. In order to perform this function, the test pattern needs to control the behavior of the design at the fault site such that it differs in the good and faulty circuits and then the difference has to be observed at a point that is measurable in the design.

As devices enter the sub-micron era, the task of devising test patterns that can achieve reasonable fault coverage becomes increasingly difficult. To exhaustively test the combinational circuitry of such sub-micron designs, a very large number of test patterns are required to test all faults in the design. A single test pattern can detect a number of faults simultaneously and there is a correlation between the number of faults detected by a pattern and the number of inputs that need to be constrained to detect the faults. If the requirements to control and observe a fault require too many inputs of the design to be controlled then the tests for different faults most probably conflict in some position and unique tests would be needed to detect different faults. These factors lead to the explosion in test data volume.

The number of test patterns has a significant impact on the costs associated with testing the integrated circuits. For instance, as the number of tests increases, the time required for testing the ICs will be longer. In addition, automatic testing equipment (ATE) must be constantly upgraded with more and more memory in order to cope with the increasing test data volume. Further, more time is needed for generating a very large number of test patterns.

Therefore, what is needed is a method and system for controlling test data volume in deterministic ATPG. What is also needed is a method and system for reducing test data volume without sacrificing fault coverage.

SUMMARY OF THE DISCLOSURE

Accordingly, the present invention provides a method and system for controlling test data volume in deterministic ATPG by test point insertion. The present invention also provides a method and system for inserting test points in a cost effective and minimally intrusive manner. Effective insertion of test points increases the number of observable and/or controllable points thereby augmenting the process of deterministic test pattern generation and reducing the number of test vectors required for testing integrated circuits.

In accordance with an embodiment of the present invention, a fault list having all the potential faults of an input integrated circuit design is initialized and all the potential faults are marked as untestable. Then, a set of deterministic test patterns, T, for testing several of the potential faults are generated by ATPG. A fault simulation process is then performed on the integrated circuit design with the test patterns, T, to mark off additional detectable faults. Significantly, during fault simulation, fault propagation is monitored to determine the nets in the design to which untested faults propagate. The nets at which fault propagation discontinues (e.g., where they are blocked off if the fault effect does not reach an observable point) are also monitored. This information is collected over the sets of test patterns, T, that are fault simulated. Based on this fault propagation information, particular ones of the nets are selected for test point insertion such that, when the test points are inserted, additional faults would be detected by the set of test patterns, T. These steps are then repeated for another set of test patterns until the desired fault coverage is achieved, significantly reducing test data volume.

In one embodiment, the nets to which most untested faults propagate are selected for test point insertion to create observability. The number of test points selected may be determined by user-defined parameters. Further, according to an embodiment of the present invention, observe point circuits and control point circuits may be inserted.

Specifically, embodiments of the present invention include an electronic design automation system that comprises: a processor; a bus coupled to the processor; and a computer readable memory coupled to the bus and having stored therein computer readable program code for causing the electronic design automation system to perform a method of improving fault coverage of test patterns for testing integrated circuits. In one embodiment, the method comprises the steps of: a) accessing a netlist description of an integrated circuit design that include logic cells intercoupled by nets; b) generating a set of test patterns for testing a set of potential faults; c) monitoring fault propagation of the untested potential faults during fault simulation; d) generating fault propagation information of the untested potential faults; and e) based on the fault propagation information, selecting appropriate nets for test point insertion for causing some of the untested potential faults to become detectable by the set of test patterns.

BRIEF DESCRIPTION OF THE DRAWINGS

The accompanying drawings, which are incorporated in and form a part of this specification, illustrate embodiments of the present invention and, together with the description, serve to explain the principles of the invention.

DETAILED DESCRIPTION OF THE PREFERRED EMBODIMENTS

Figure 1:
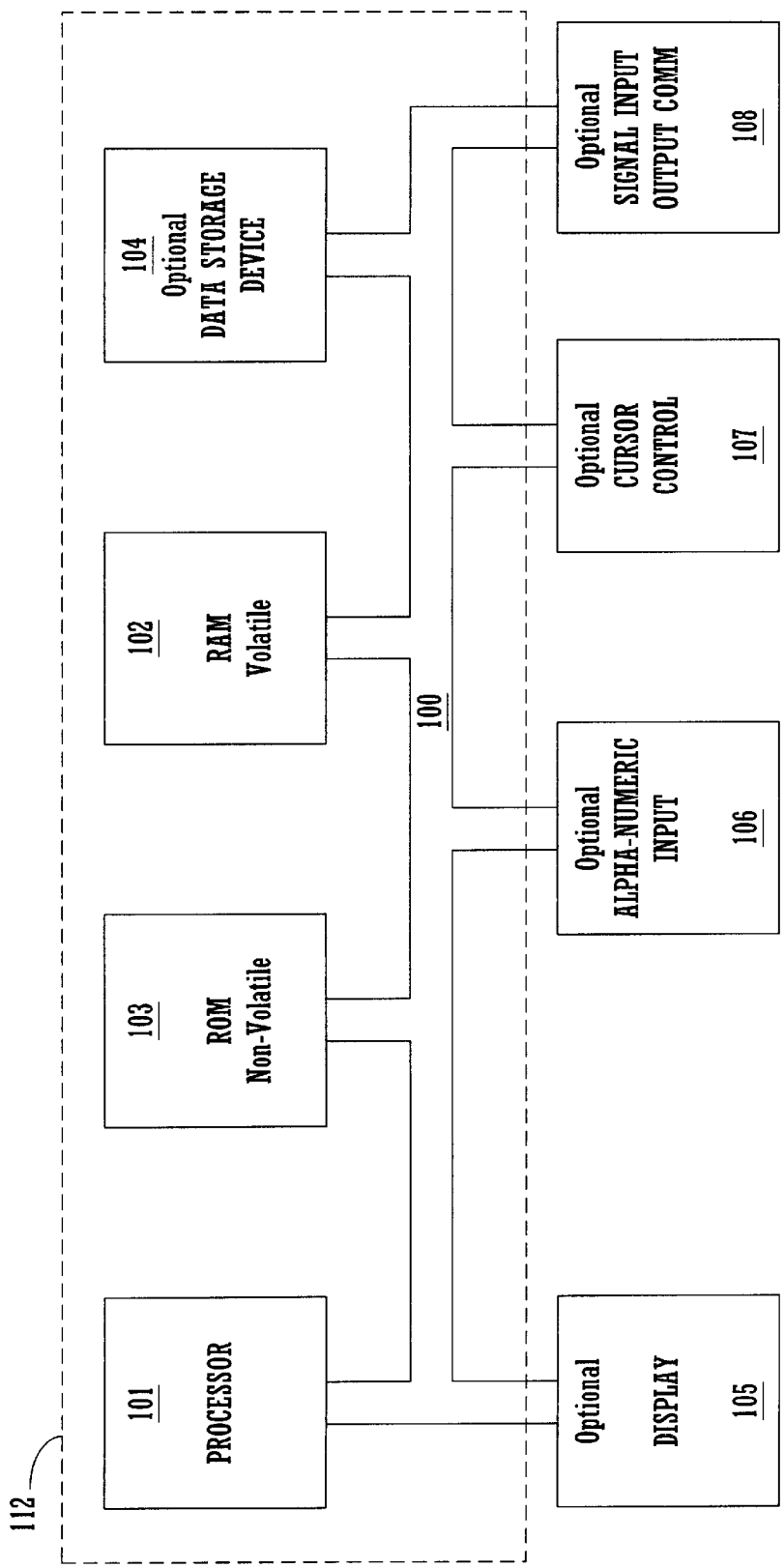
FIG. 1 illustrates a computer system operable as a platform on which embodiments of the present invention may be implemented.

In the following detailed description of the preferred embodiments, for purposes of explanation, numerous specific details are set forth in order to provide a thorough understanding of the present invention. However, it will be apparent to one skilled in the art that the present invention may be practiced without these specific details. In other instances, well-known structures and devices are not described in detail in order to avoid obscuring aspects of the present invention.

I. Notation and Nomemclature

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here and generally conceived to be a self-consistent sequence of steps of instructions leading to a desired result. The steps are those requiring physical manipulations of data representing physical quantities to achieve tangible and useful results. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "accessing", "determining", "generating", "associating", "assigning" or the like, refer to the actions and processes of a computer system, or similar electronic computing device. The computer system or similar electronic device manipulates and transforms data represented as electronic quantities within the computer system's registers and memories into other data similarly represented as physical quantities within the computer system memories into other data similarly represented as physical quantities within the computer system memories or registers or other such information storage, transmission, or display devices.

II. Computer System Platform

Aspects of the present invention, method and system for reducing test data volume in deterministic ATPG, are discussed in terms of steps executed on a computer controlled EDA system. These steps (e.g., process 300) are implemented as program code stored in computer readable memory units of a computer system and are executed by the processor of the computer system. Although a variety of different computer systems can be used with the present invention, an exemplary general purpose computer system 112 is shown in FIG. 1.

In general, computer system 112 includes an address/data bus 100 for communicating information, a central processor 101 coupled with the bus for processing information and instructions, a volatile memory 102 (e.g., random access memory RAM) coupled with the bus 100 for storing information and instructions for the central processor 101 and a non-volatile memory 103 (e.g., read only memory ROM) coupled with the bus 100 for storing static information and instructions for the processor 101. Computer system 112 also includes a data storage device 104 ("disk subsystem") such as a magnetic or optical disk and disk drive coupled with the bus 100 for storing information and instructions and a display device 105 coupled to the bus 100 for displaying information to the computer user. Data storage device 104 can include one or more removable magnetic or optical storage media (e.g., diskettes, tapes) which are computer readable memories. It is appreciated that data produced at the various logic synthesis stages of the present invention, including representations of the different levels of abstraction of the integrated circuit design, such as a netlist, can also be stored in RAM 102, ROM 103 or the storage device 104.

Also included in computer system 112 of FIG. 1 is an alphanumeric input device 106 including alphanumeric and function keys coupled to the bus 100 for communicating information and command selections to the central processor 101. Computer system 112 also includes a cursor control or directing device 107 coupled to the bus for communicating user input information and command selections to the central processor 101. Computer system 112 can also include an optional signal generating device 108 coupled to the bus 100 for interfacing with other networked computer systems. The display device 105 utilized with the computer system 112 of the present invention may be a liquid crystal device, other flat panel display, cathode ray tube, or other display device suitable for creating graphic images and alphanumeric characters recognizable to the user.

III. Reducing Test Data Volume in Deterministic Test Pattern Generation by Test Point Insertion Generally, a test pattern is created for a specific fault modeled in the design such that when the fault exists the observable behavior of the IC would be different than that of an IC without that fault present. In order to perform this function the test pattern needs to control the behavior of the device under test (DUT) at the fault site such that it differs in the good and faulty circuit and such that the difference has to be observed at a point that is measurable in the design. If the requirements to control and observe a fault require too many inputs of the design to be controlled then the tests for different faults most probably conflict in some position and unique tests would be needed to detect different faults. This leads to the explosion in test data volume.

The present invention provides a method and system for controlling test data volume by augmenting the deterministic test generation process with test points. By inserting test points (e.g., observe points and/or control points) at "key" locations, in most cases, the number of deterministic test patterns required for high fault coverage would be significantly reduced.

Figure 2A:
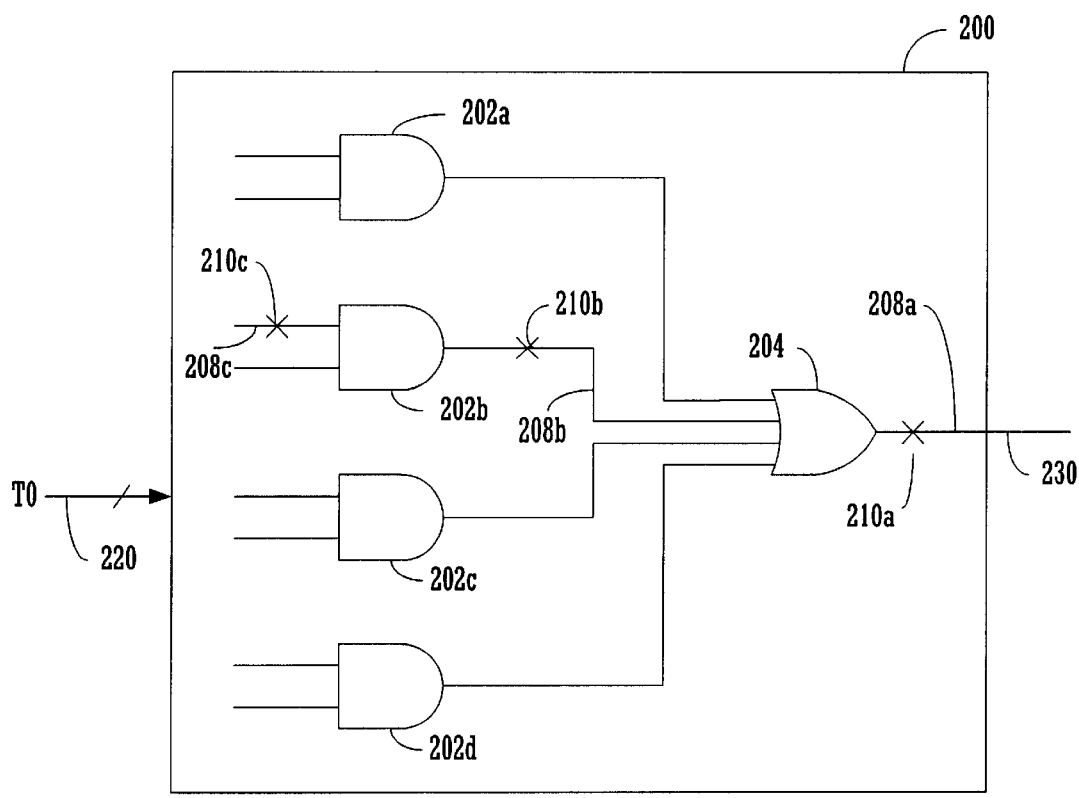
FIG. 2A is a gate-level diagram representation of a portion of an exemplary netlist according to one embodiment of the present invention.
Figure 2B:
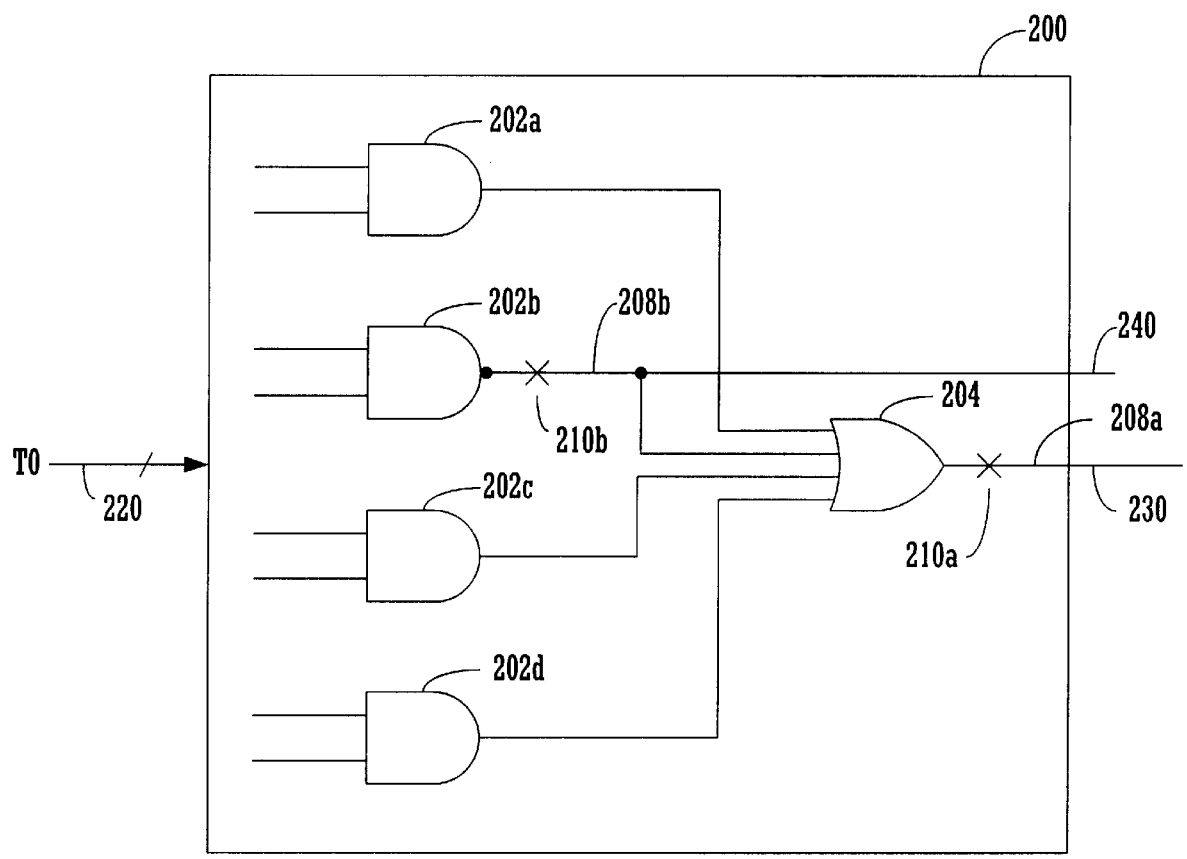
FIG. 2B is a gate-level diagram representation of the exemplary netlist of FIG. 2A incorporated with a test point according to one embodiment of the present invention.
Figure 2C:
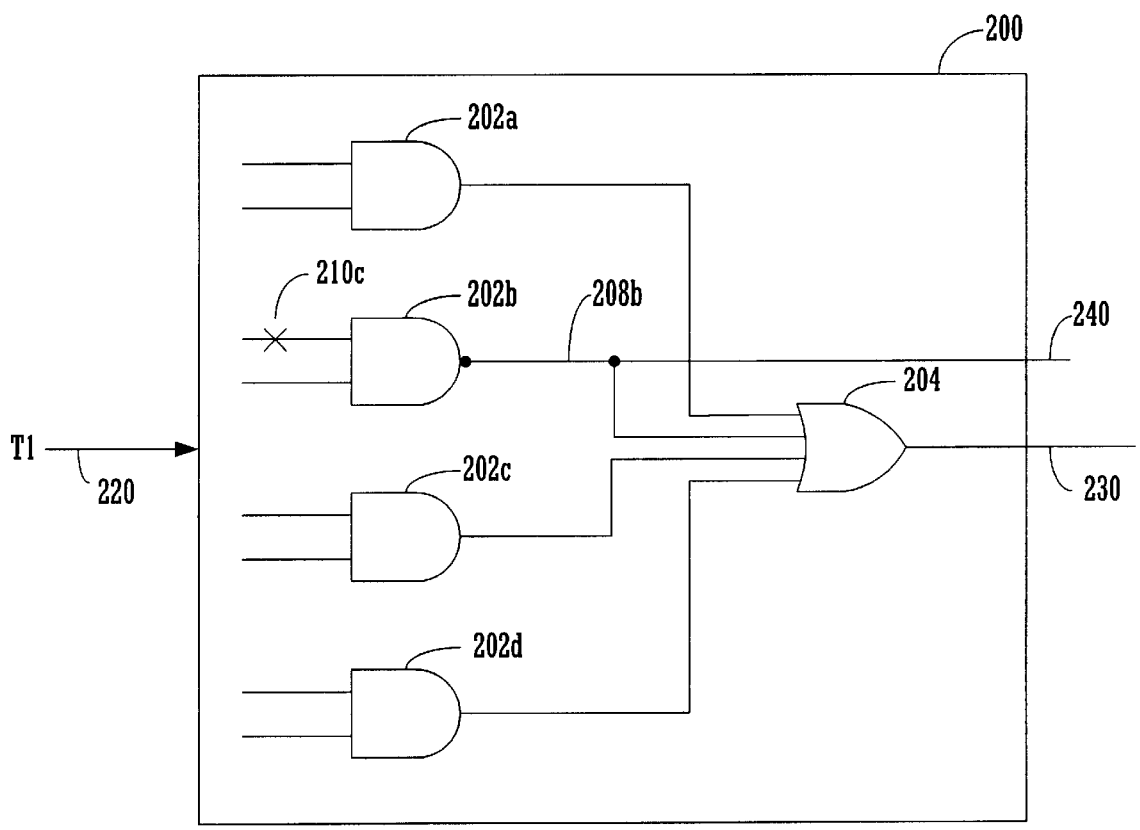
FIG. 2C is a gate-level diagram representation of the exemplary netlist of FIGS. 2A and 2B where the test point enables another test pattern to detect another fault according to one embodiment of the present invention.

The benefits of adding test points are exemplified in FIGS. 2A–2C which illustrate exemplary circuits having faults that are not propagated to the output pins. FIG. 2A is a gate-level diagram representation of a portion of an exemplary netlist 200 that includes a number of nets intercoupling a number of logic elements (e.g., AND gates 202a–202d and OR gate 204). Netlist 200 further includes potential faults 210a–210c that may exist on nets 208a–208c, respectively. Each of the potential faults 210a–210c is marked by an "X" in FIG. 2A. The potential faults 210a–210c may be electrical faults (e.g., shorts, opens, transistor stuck-on, stuck-open, etc.) or logical faults (e.g., logical stuck-at-0, stuck-at-1, etc.). For the purpose of illustration, it is assumed that when a test pattern, T0, is applied via input 220, potential faulty effect of fault 210a may be observed from output 230. Further, it is assumed that the other potential faults 210b–210c are unobservable from output 230 when test pattern T0 is applied due to OR gate 204. Without using test points, it may be necessary to generate separate test patterns for testing potential faults 210b–210c.

As illustrated in FIG. 2B, an observe point 240 is incorporated into exemplary netlist 200, allowing potential fault 210b to be observed via observe point 240 when test pattern T0 is applied. Thus, because T0 is sufficient for causing an observable response via observe point 240, a separate test pattern for testing potential fault 210b is no longer necessary. In addition, observe point 240 may allow other potential faults that propagate to net 208b to be detected. For example, as illustrated in FIG. 2C, potential fault 210c may propagate to net 208b when a test pattern T1 is applied via input 220. In that case, potential fault 210c may be observed via observe point 240. In this way, by inserting ATPG intelligent observe points strategically within the integrated circuit design, test data volume can be reduced tremendously as fault coverage of each test pattern increases.

In the extreme case, for every "hard" fault (e.g., fault that can only be detected by a few test patterns), a test point can be inserted at the fault location. However, test points are intrusive in the design and they come with an associated cost. To minimize intrusion for maximum benefit, the present invention also provides a process that reduces the number of deterministic test patterns yet maximizing fault coverage.

Figure 3:
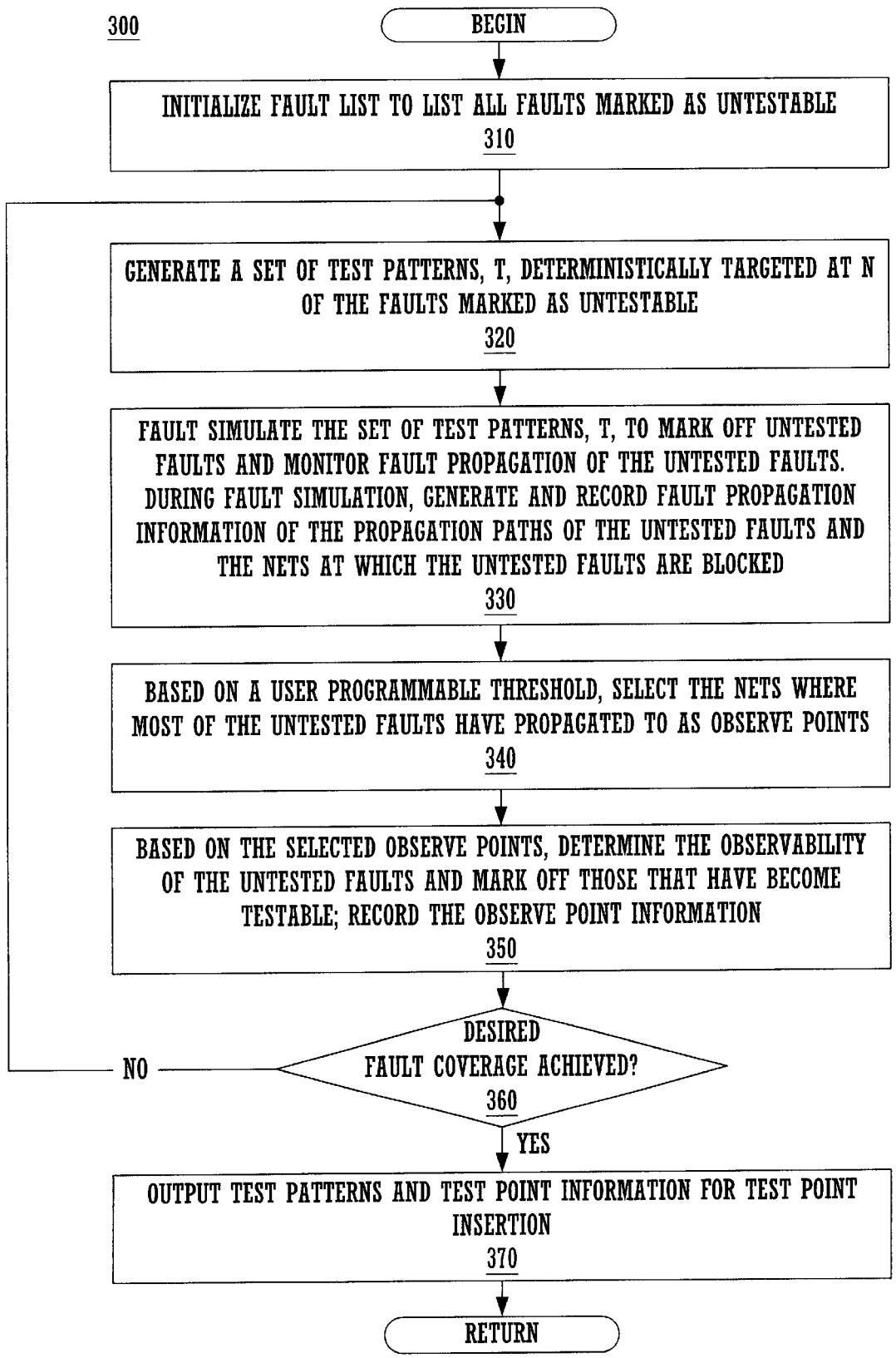
FIG. 3 is a flow chart diagram illustrating steps of a process for generating a reduced number of test patterns by inserting test points according to an embodiment of the present invention.

FIG. 3 is a flow diagram illustrating steps of a process 300 for generating a reduced number of test patterns by inserting test points according to an embodiment of the present invention. In the present embodiment, process 300 is represented as instructions stored in memory and executed by a processor within computer system 112 (FIG. 1). For simplicity, in the present embodiment, only observe points are inserted to reduce the number of deterministic test patterns. However, it should be noted that other types of test points (e.g., control points) may also be used in alternate embodiments of the present invention.

The goal of process 300 is to minimize the number of test patterns by inserting test points (e.g., observe points and/or control points) in a cost-effective manner. The process 300 is based upon the observation that when the number of patterns is minimized, the effectiveness of test patterns is maximized to achieve equivalent fault coverage.

As illustrated in FIG. 3, at step 310, process 300 analyzes an input netlist of an integrated circuit device to generate a fault list containing all the potential faults of the design. The input netlist is stored in computer readable memory. According to the present embodiment, process 300 initializes the fault list by marking all the potential faults as untestable at step 310.

At step 320, an automatic test pattern generation (ATPG) process is carried out to generate a set of test patterns, T, for applying to the inputs of the IC device and for detecting a number of untested faults listed in the fault list. ATPG mechanisms are well known in the art and any number of well known and commercially available ATPG processes can be applied at step 320. Well known ATPG details are not described herein to avoid obscuring aspects of the present invention.

Step 320 also attempts to compact the patterns during the ATPG processes as much as possible. As is well known, some test patterns may be mergeable with each other. For example, a test pattern "1010XXXX" for detecting fault-a and a test pattern "XXXX1110" for detecting fault-b may be merged to form a test pattern "10101110" for testing both fault-a and fault-b. The volume of data is reduced by compacting and merging the test patterns. Efficient algorithms for compacting and merging test patterns are well known in the art and can be applied at step 320. In the present embodiment, the number of patterns generated before terminating the ATPG processes 320 could be determined by a user-defined parameter.

With reference to FIG. 3, at step 330, a fault simulation process is performed on the set of test patterns T. A test pattern that is targeted at a particular fault may be able to detect additional faults by chance. Thus, one objective of the fault simulation process is to determine the additional faults that are caught by the set of test patterns T. After fault simulation, all the faults that are detected by the set of test patterns T are marked off from the fault list as "tested."

Significantly, during fault simulation of step 330, the propagation of faults is closely monitored to determine the nets in the design to which the untested faults were propagated. In addition, if an untested fault gets blocked, e.g., it not reach an observable point (e.g., output 230), the net at which the propagation became blocked is also monitored. In the present embodiment, this fault propagation information is collected over the set of test patterns T and recorded in computer memory.

Figure 4A:
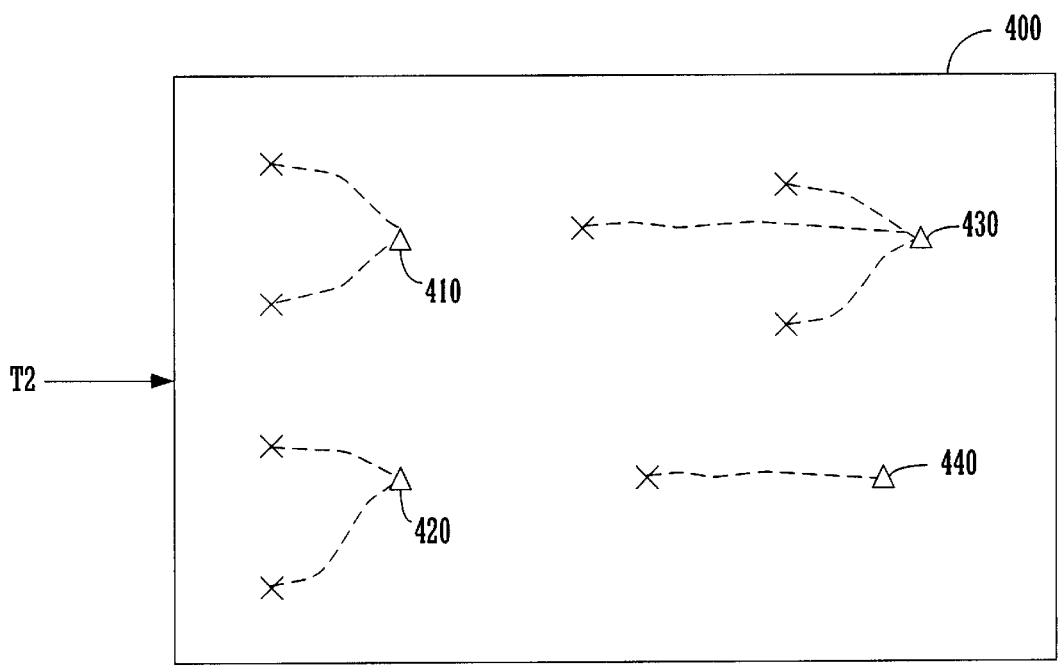
FIG. 4A illustrates a fault propagation graph of an integrated circuit design undergoing the fault simulation process in accordance with one embodiment of the present invention.
Figure 4B:
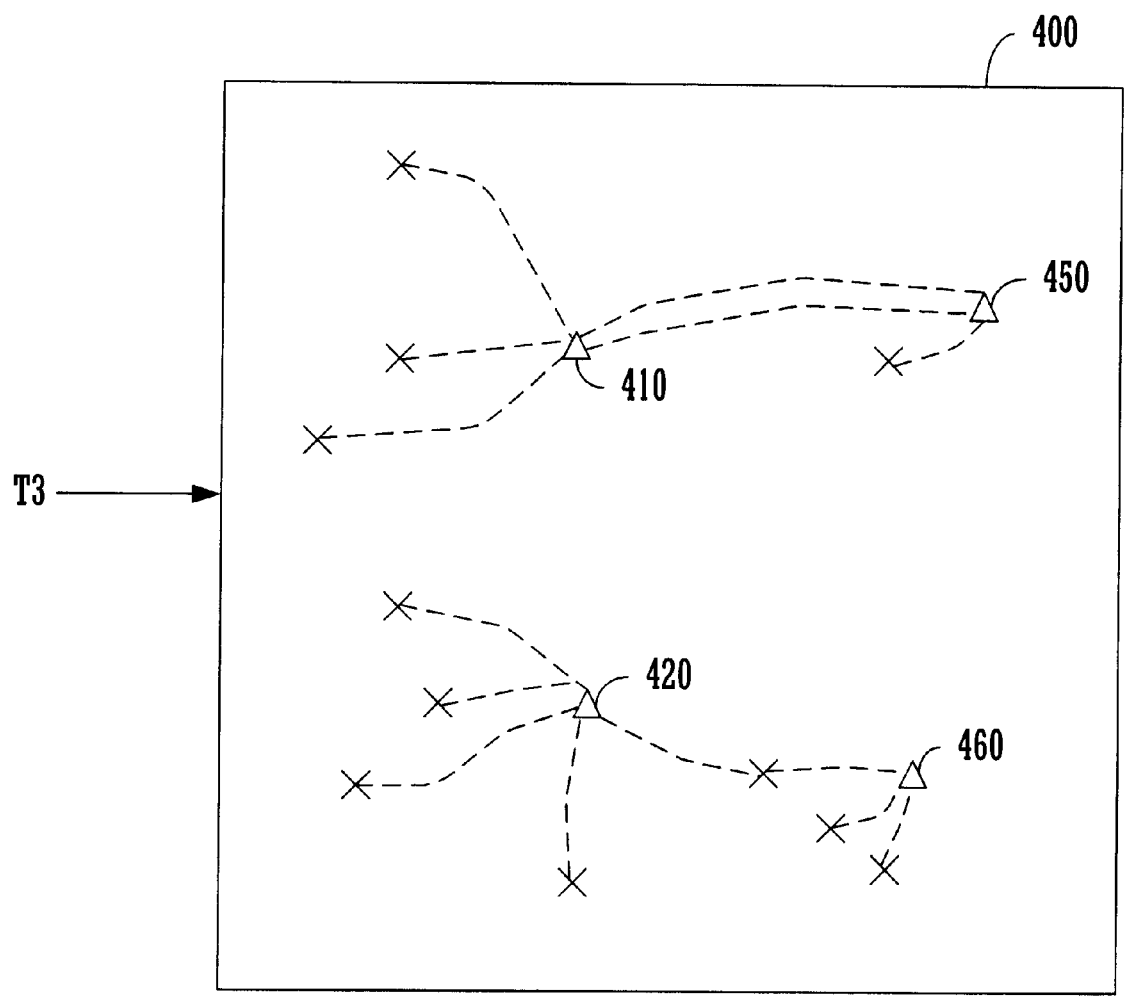
FIG. 4B illustrates the fault propagation graph of FIG. 4A undergoing the fault simulation process in accordance with one embodiment of the present invention.

FIGS. 4A–4B illustrate a fault propagation graph 400 of an integrated circuit design undergoing the fault simulation process 330 of the present invention in accordance with one embodiment of the present invention. As illustrated in FIG. 4A, netlist 400 includes a plurality of faults (each of which is marked with an "X") that are undetected by test pattern T2. Potential faults that are detected by test pattern T2, however, are not illustrated in FIG. 4A. The untested faults X are undetected by test pattern T2 because the propagation of the faults is somehow blocked. There may be numerous reasons that causes the propagation to be blocked and thereby not reach an output pin. For example, fault propagation may be blocked because the propagation path connecting a fault to an output is de-sensitized. In FIG. 4A, such fault propagation paths are illustrated with dotted lines. As illustrated, two propagation paths are blocked at net 410, two paths are blocked at net 420, three paths are blocked at net 430 and one path is blocked at net 440.

FIG. 4B illustrates the propagation paths of faults that are undetected by test pattern T3. Similar to FIG. 4A, each of the untested faults are marked with "X" and fault propagation paths are illustrated with dotted lines in FIG. 4B. Some propagation paths in FIG. 4B pass through net 410 but are blocked at net 450. In addition, some propagation paths pass through net 420 but are blocked at net 460. Some propagation paths in FIG. 4B, like those in FIG. 4A, are blocked at the nets 410 and 420. This fault propagation information is generated by the fault simulation process 330 and is collected for use at step 340 of process 300. Particularly, with respect to all propagation paths of FIG. 4A and 4B, the net of which the path becomes blocked is recorded at step 330.

With reference back to FIG. 3, at step 340, a selection process is performed to select the nets through which most untested faults propagate for observe point insertion. For example, as illustrated in FIGS. 4A and 4B, a total of five fault propagation paths (of untested faults) reach net 410 and a total of six fault propagation paths (of untested faults) reach net 420. On the other hand, three fault propagation paths (of untested faults) reach net 430 while only one fault propagation path (of untested fault) reaches net 440. Thus, according to the present embodiment, in order to maximize the effectiveness of the test patterns and the test points, nets 410 and 420 are selected for observe point insertion.

In the present example, a "greedy" algorithm is chosen to select the test points. However, it should be noted that the present invention also covers other algorithms for selecting test points. For instance, the number of nets selected for observe point insertion may be determined by a user-defined threshold. In another example, the user of system 112 may define a minimum number, or threshold number, of fault propagation paths (of untested faults) must pass through the net before it is selected for test point insertion. In yet another example, the user may define a maximum number of nets to be selected for test point insertion.

At step 350, based upon the observe points selected at step 340, faults that are now detectable with test patterns T are marked off from the fault list as "tested." In addition, information regarding the nets that are selected for test point insertion are collected for use by other EDA processes. For example, certain DFT (design-for-test) tools may require such information for inserting test point circuits within the netlist of integrated circuit design.

With reference to FIG. 3, at step 360, it is determined whether a desired fault coverage has been achieved based on a user programmable coverage percentage, for example. In the present embodiment, the fault coverage is calculated from dividing a number of faults tested by a total number of faults that are modeled. Further, the desired fault coverage figure may be determined by a user-defined parameter as described above.

If it is determined that a desired fault coverage has not yet been achieved, steps 320 to 350 are repeated. Otherwise, at step 370, the test patterns generated at step 320 and the test point information collected at step 350 are provided as outputs to other EDA processes. For example, test point insertion procedures may be performed based on the test point information to modify the netlist of the integrated circuit design. Thereafter, the process 300 ends.

The present invention, a method of and system for reducing test data volume in deterministic test pattern generation, has thus been disclosed. The present invention allows increases the effectiveness of the test patterns by using test points and thus reduces the total number of test patterns required. The present invention further provides a method for inserting test points in a cost-effective manner. While the present invention has been described in particular embodiments, it should be appreciated that the present invention should not be construed as limited by such embodiments, but should be construed according to the claims below.

What is claimed is:

1. In a computer controlled electronic design automation system, a method of improving fault coverage of test patterns for testing integrated circuits, said method comprising the steps of:
   a) accessing a netlist description of an integrated circuit design comprising a plurality of logic cells intercoupled by a plurality of nets;
   b) generating a plurality of test patterns for testing a first plurality of faults of said integrated circuit design;
   c) fault simulating of said plurality of test patterns;
   d) during said fault simulating step (c), monitoring fault propagation of a second plurality of faults that are untested by said plurality of test patterns;
   e) generating fault propagation information of said second plurality of faults; and
   f) based on said fault propagation information, selecting appropriate ones of said plurality of nets for test point insertion, said step (f) causing a portion of said second plurality of faults to be detectable by said plurality of test patterns.

2. A method as recited in claim 1 wherein said step (c) further comprises the steps of:
   c1) recording respective ones of said plurality of nets to which said second plurality of faults propagate; and
   c2) recording respective ones of said plurality of nets where propagation of said second plurality of faults discontinues.

3. A method as recited in claim 1 further comprising the step of
   (g) inserting test point circuits at said appropriate ones of said plurality of nets selected at said step (f).

4. A method as recited in claim 3 wherein said test point circuits comprise an observe point circuit.

5. A method as recited in claim 3 wherein said test point circuits comprise a control point circuit.

6. A method as recited in claim 1 further comprising the step of repeating said steps (b) to (f) until a predetermined threshold of fault coverage is achieved.

7. A method as recited in claim 1 wherein a number nets selected for test point insertion by said step (f) is determined by a user-defined threshold.

8. A method as recited in claim 1 wherein said step (f) further comprises the steps of:
   f1) selecting a respective one of said plurality of nets to which a predetermined threshold of said second plurality of fault propagate; and
   f2) selecting said respective one of said plurality of nets for test point insertion.

9. A method as recited in claim 1 wherein said plurality of test patterns are deterministic test patterns.

10. A method as recited in claim 1 wherein said step (b) further comprises the step of compacting and merging said plurality of test patterns to further reduce test data volume.

11. In a computer controlled electronic design automation system, a method of improving fault coverage of test patterns for testing integrated circuits, said method comprising the steps of:
   a) accessing a netlist description of an integrated circuit design comprising a plurality of logic cells intercoupled by a plurality of nets;
   b) generating a plurality of deterministic test patterns for testing a first plurality of faults of said integrated circuit design, wherein a second plurality of faults are undetected by said plurality of deterministic test patterns; and
   c) causing respective ones of said second plurality of faults to become detectable by said plurality of deterministic test patterns by selecting appropriate ones of said plurality of nets for test point insertion.

12. A method according to claim 11 wherein said step (c) comprises the steps of:
   monitoring fault propagation of said second plurality of faults during fault simulation of said plurality of test patterns; and
   generating fault propagation information of said second plurality of faults wherein said appropriate ones of said plurality of nets are selected based on said fault propagation information.

13. A method as recited in claim 12 wherein said step of monitoring further comprises the steps of:
   recording respective ones of said plurality of nets to which said second plurality of faults propagate; and
   recording respective ones of said plurality of nets where propagation of said second plurality of faults discontinues.

14. A method as recited in claim 11 wherein said step (c) further comprises the steps of:
   fault simulating said plurality of deterministic test patterns;
   monitoring fault propagation of said second plurality of faults during said fault simulating step and generating fault propagation information thereof;
   selecting a respective one of said plurality of nets to which a predetermined number of said second plurality of faults propagate; and
   selecting said respective one of said plurality of nets for test point insertion.

15. A method as recited in claim 11 further comprising the step of inserting test point circuits at said appropriate ones of said plurality of nets.

16. A method as recited in claim 15 wherein said test point circuits comprise an observe point circuit.

17. A method as recited in claim 15 wherein said test point circuits comprise a control point circuit.

18. A method as recited in claim 11 further comprising the step of repeating said steps (b) and (c) until a predetermined threshold of fault coverage is achieved.

19. A method as recited in claim 11 wherein a number nets selected for test point insertion by said step (c) is determined by a user-defined threshold.

20. A method as recited in claim 11 further comprising the step of compacting and merging said plurality of deterministic test patterns to further reduce test data volume.

21. An electronic design automation system comprising:
   a processor;
   a bus coupled to said processor; and
   a computer readable memory coupled to said bus and having stored therein computer readable program code for causing said electronic design automation system to perform a method of improving fault coverage of test patterns for testing integrated circuits, said method comprising the steps of:
   a) accessing a netlist description of an integrated circuit design that has a plurality of logic cells intercoupled by a plurality of nets;
   b) generating a plurality of test patterns for testing a first plurality of faults of said integrated circuit design;
   c) fault simulating said plurality of test patterns;
   d) monitoring fault propagation of a second plurality of faults that are untested by said plurality of test patterns during said fault simulating step (c);
   e) generating fault propagation information of said second plurality of faults; and
   f) based on said fault propagation information, selecting appropriate ones of said plurality of nets for test point insertion, said step (f) causing respective ones of said second plurality of faults to become detectable by said plurality of test patterns.

22. An electronic design automation system as recited in claim 21 wherein said step (c) further comprises the steps of:
   recording respective ones of said plurality of nets to which said second plurality of faults propagate; and
   recording respective ones of said plurality of nets where propagation of said second plurality of faults discontinues.

23. An electronic design automation system as recited in claim 21 wherein said method further comprises the step of
   (g) inserting test point circuits at said appropriate ones of said plurality of nets.

24. An electronic design automation system as recited in claim 23 wherein said test point circuits comprise an observe point circuit.

25. An electronic design automation system as recited in claim 23 wherein said test point circuits comprise a control point circuit.

26. An electronic design automation system as recited in claim 21 wherein said method further comprises the step of repeating said steps (b) to (f) until a predetermined threshold of fault coverage is achieved.

27. An electronic design automation system as recited in claim 21 wherein a number of nets selected by said step (f) is determined by a user-defined threshold.

28. An electronic design automation system as recited in claim 21 wherein said step (f) further comprises the steps of:
   f1) selecting a respective one of said plurality of nets to which most of said second plurality of fault propagate; and
   f2) selecting said respective one of said plurality of nets for test point insertion.

29. An electronic design automation system as recited in claim 21 wherein said set of test patterns are deterministic test patterns.

30. An electronic design automation system as recited in claim 21 wherein said method further comprises the step of compacting and merging said plurality of deterministic test patterns to further reduce test data volume.

* * * * *